United States Patent
Matsui (10) Patent No.: US 8,279,692 B2
(45) Date of Patent: Oct. 2, 2012

(54) SEMICONDUCTOR DEVICE HAVING HIERARCHICAL DATA LINE STRUCTURE AND CONTROL METHOD THEREOF

(75) Inventor: Yoshinori Matsui, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 187 days.

(21) Appl. No.: 12/910,496

(22) Filed: Oct. 22, 2010

(65) Prior Publication Data
US 2011/0096585 A1   Apr. 28, 2011

(30) Foreign Application Priority Data
Oct. 23, 2009   (JP) ................. 2009-244390

(51) Int. Cl.
*G11C 7/00* (2006.01)
(52) U.S. Cl. ............. 365/203; 365/189.09; 365/189.12; 365/196; 365/72
(58) Field of Classification Search .......... 365/203, 365/189.09, 189.12, 196, 72
See application file for complete search history.

(56) References Cited

U.S. PATENT DOCUMENTS
6,894,940 B2   5/2005   Kono et al.
2002/0167853 A1*  11/2002   Kojima ............. 365/202

FOREIGN PATENT DOCUMENTS
JP   2004-234704 A   8/2004
* cited by examiner

*Primary Examiner* — Thong Q Le
(74) *Attorney, Agent, or Firm* — Sughrue Mion, PLLC (57) ABSTRACT

To provide a semiconductor device including switch transistor provided between a sub-data line and a main data line. Upon transferring data, the semiconductor device supplies a potential of a VPP level to a gate electrode of the switch transistor when causing the switch transistor to be a conductive state, and supplies a potential of a VPERI level to the gate electrode when causing the switch transistor to be a non-conductive state. According to the present invention, because a potential of the gate electrode is not decreased to a VSS level when causing the switch transistor to be a non-conductive state, it is possible to reduce a current required to charge and discharge a gate capacitance of the switch transistor. Furthermore, because the VPP level is supplied to the gate electrode when causing the switch transistor to be a conduction state, a level of a signal after transfer never drops down by the amount of the threshold voltage.

19 Claims, 6 Drawing Sheets

SEMICONDUCTOR DEVICE HAVING HIERARCHICAL DATA LINE STRUCTURE AND CONTROL METHOD THEREOF

BACKGROUND OF THE INVENTION

1. Field of the Invention

The present invention relates to a semiconductor device and a control method thereof, and more particularly relates to a semiconductor device including a hierarchical data line structure and a control method thereof.

2. Description of Related Art

A semiconductor memory such as a DRAM (Dynamic Random Access Memory) includes a plurality of memory cells configured to be selected by a word line and a bit line, and read data read from a memory cell is output from the bit line to a data terminal through various signal paths. Normally, the signal paths from the bit line to the data terminal are hierarchized, and data transfer is performed via a switch circuit provided between different hierarchical levels.

An example of a semiconductor memory having signal paths that are hierarchized into a sub-data line LIO and a main data line GIO is shown in FIG. 2 of Japanese Patent Application Laid-open No. 2004-234704, in which the sub-data line LIO and the main data line GIO are connected to each other via switch transistors 61 and 62. The switch transistors 61 and 62 are N-channel MOS transistors, and a connection signal IOSW is supplied to gate electrodes of the switch transistors 61 and 62. Therefore, when the connection signal IOSW is the high level, the sub-data line LIO and the main data line GIO are connected to each other, and when the connection signal IOSW is the low level, the sub-data line LIO and the main data line GIO are disconnected from each other.

However, in the semiconductor memory described in Japanese Patent Application Laid-open No. 2004-234704, because a level of the connection signal IOSW swings at full range between the high level and the low level every time connection and disconnection of the sub-data line LIO and the main data line GIO are repeated, there is a problem that it requires a large current to charge and discharge the gate capacitances of the switch transistors 61 and 62. In addition, because the switch transistors 61 and 62 are the N-channel MOS transistors, when transferring a high level signal, there is another problem that a level of a signal after transfer drops down by the amount of a threshold voltage.

SUMMARY

In one embodiment, there is provided a semiconductor device having a hierarchical data line structure performing transfer of data having an amplitude between a first potential and a second potential by controlling connection and disconnection of a sub-data line and a main data line that includes: a switch transistor provided between the sub-data line and the main data line; a precharge circuit that precharges at least one of the sub-data line and the main data line to the second potential before transferring the data; and a control unit that controls a potential to be supplied to a control electrode of the switch transistor, wherein upon transferring the data, the control unit supplies a third potential having an absolute value larger than an absolute value of the second potential to the control electrode when causing the switch transistor to be a conductive state, and supplies a fifth potential having an absolute value at least larger than an absolute value of the first potential and smaller than an absolute value of a fourth potential to the control electrode when causing the switch transistor to be a non-conductive state, where the fourth potential is a potential with which the switch transistor is in a conductive state.

In one embodiment, there is provided a method of controlling a semiconductor device having a hierarchical data line structure performing transfer of data having an amplitude between a first potential and a second potential by controlling conduction and non-conduction of a switch transistor connected between a sub-data line and a main data line that includes: supplying a third potential having an absolute value larger than an absolute value of the second potential to a control electrode of the switch transistor; supplying a fifth potential having an absolute value at least larger than an absolute value of the first potential and smaller than an absolute value of a fourth potential to the control electrode after the supplying the third potential, where the fourth potential is a potential with which the switch transistor is in a conductive state; and supplying the third potential to the control electrode after the supplying the fifth potential.

According to the present invention, when setting a switch transistor to a non-conductive state at the time of data transfer, because the fifth potential larger than the first potential is supplied to the control electrode, it is possible to reduce the current required to charge and discharge the gate capacitance of the switch transistor. Further, when setting the switch transistor to a conductive state at the time of data transfer, because the third potential larger than the second potential is supplied to the control electrode, a level of a signal after transfer never drops down by the amount of the threshold voltage.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
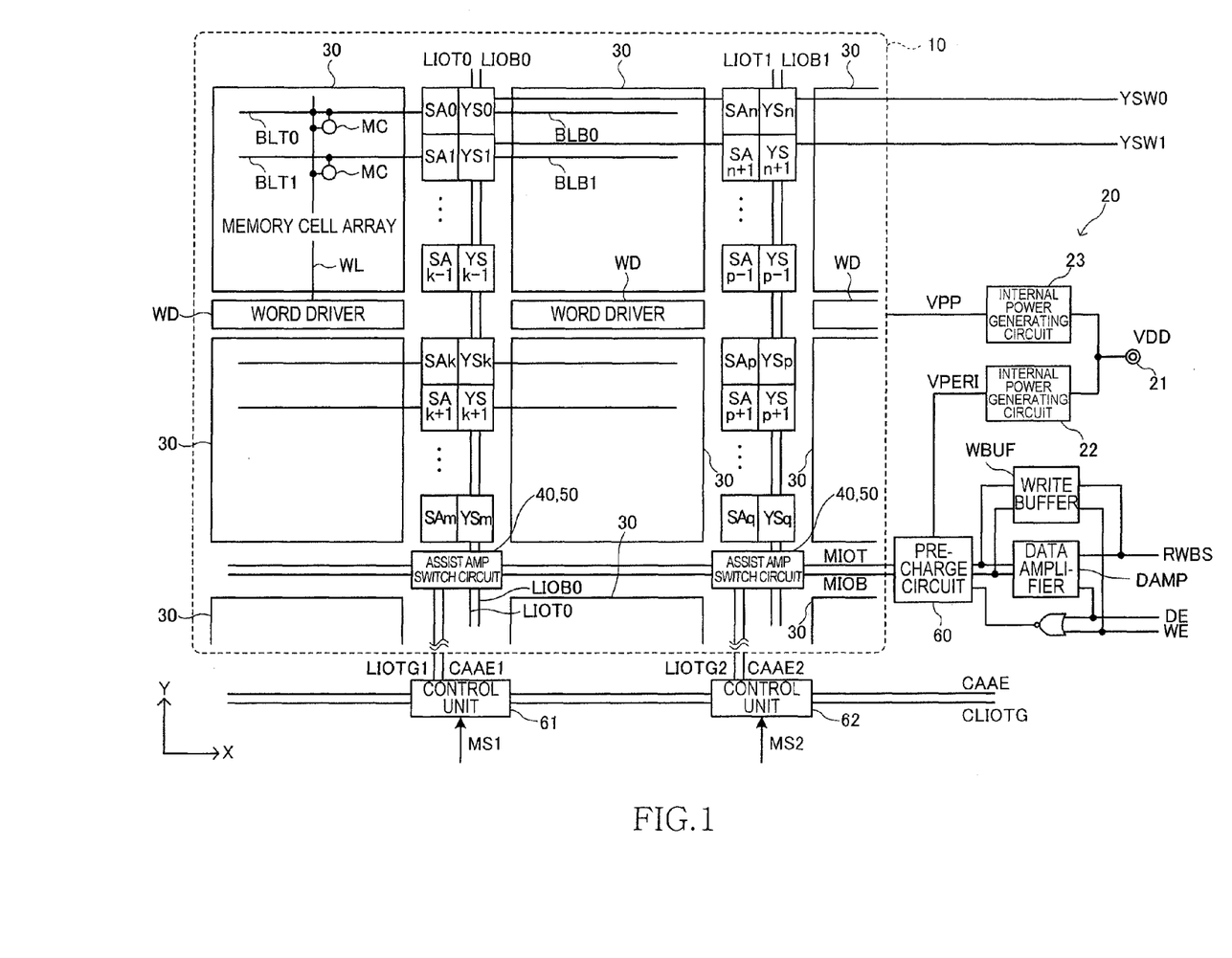
FIG. 1 is a block diagram showing a configuration of a semiconductor device according to an embodiment of the present invention.

FIG. 1 is a block diagram showing a configuration of a semiconductor device according to an embodiment of the present invention. The present embodiment is an example of applying the semiconductor device according to the present invention to a DRAM. However, application of the present invention is not limited to DRAMs, but the invention can be also applied to any semiconductor devices that include a hierarchical data line structure. For example, the present invention can be applied to other types of semiconductor memories, such as an SRAM, a flash memory, a PRAM, and an MRAM, and can be applied to a logic system semiconductor device such as a CPU.

The semiconductor device shown in FIG. 1 includes a memory cell area 10 and a peripheral circuit area 20 located outside the memory cell area 10. The memory cell area 10 includes a plurality of memory cell arrays 30 laid out in a matrix form in X and Y directions, a plurality of sense amplifiers SA (SA0, SA1, . . . ) and a plurality of column switches YS (YS0, YS1, . . . ) arranged between two memory cell arrays 30 adjacent to each other in the X direction, and a plurality of word drivers WD arranged between two memory cell arrays 30 adjacent to each other in the Y direction.

Each of the memory cell arrays 30 includes a plurality of word lines WL connected to a word driver WD, a plurality of bit lines BLT, BTB (BLT0/BTB0, BLT1/BTB1, . . . ) each connected to corresponding one of the sense amplifiers SA, and a plurality of memory cells MC each connected to corresponding one of the word lines WL and corresponding one of bit lines BLT or BTB.

As shown in FIG. 1, the memory cell area 10 further includes a plurality of complementary sub-data lines LIOT and LIOB (LIOT0/LIOB0, LIOT1/LIOB1, . . . ) wired in the Y direction. The sub-data lines LIOT and LIOB correspond to a lower-level data line, being connected to the bit lines BLT and BTB, respectively, via corresponding one of the column switches YS.

Further, the memory cell area 10 includes complementary main data lines MIOT and MIOB wired in the X direction. The main data lines MIOT and MIOB correspond to an upper-level data line, being connected to the sub-data lines LIOT and LIOB, respectively, via a switch circuit 40.

With this configuration, read data read from the bit lines BLT and BTB are transferred to the sub-data lines LIOT and LIOB via the column switch YS, and further transferred to the main data lines MIOT and MIOB via the switch circuit 40. The read data transferred to the main data lines MIOT and MIOB are then converted into a single-end type signal by a data amplifier DAMP provided in the peripheral circuit area 20 and output to a read/write bus RWBS that is a top-level data line.

A transfer path for write data is opposite to that for the read data. Single-end type write data that are supplied to the read/write bus RWBS are converted into complementary signals by a write buffer WBUF, and written in the bit lines BLT and BTB via the main data lines MIOT and MIOB and the sub-data lines LIOT and LIOB.

The peripheral circuit area 20 includes internal power generating circuits 22 and 23 that receive an external power VDD supplied from an external power source terminal 21 and respectively generate internal potentials VPERI and VPP. A relation between magnitudes of absolute values of these potentials is VPP>VDD≧VPERI. The internal potentials VPERI and VPP are respectively supplied to predetermined circuit blocks.

Figure 2:
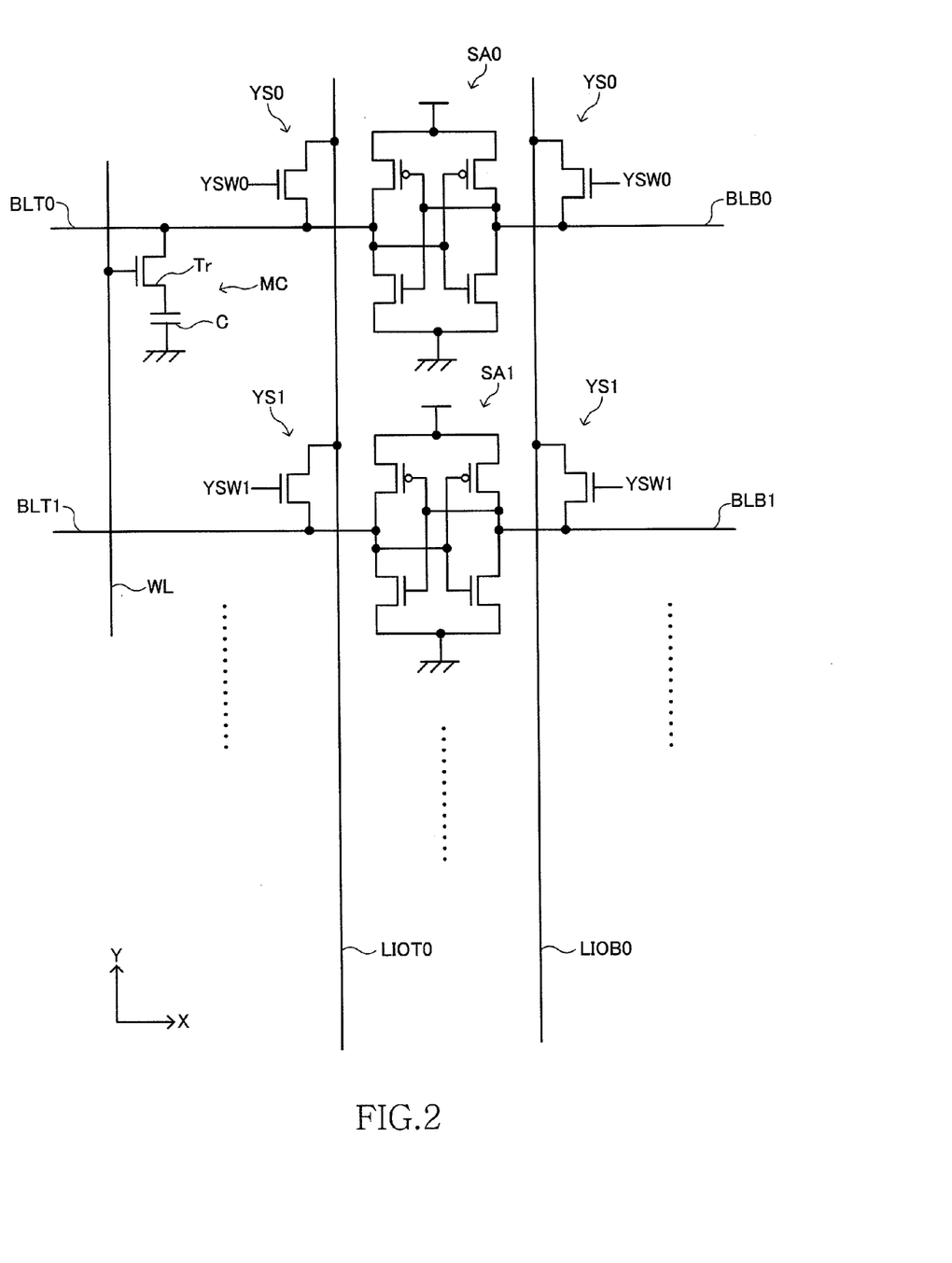
FIG. 2 is a circuit diagram showing a configuration of a main part of the memory cell area 10.

FIG. 2 is a circuit diagram showing a configuration of a main part of the memory cell area 10.

As shown in FIG. 2, the sense amplifier SA is configured with a flip-flop circuit having two P-channel MOS transistors and two N-channel MOS transistors that are cross-coupled to each other. One input/output node of the flip-flop circuit is connected to the bit line BLT and the other input/output node is connected to a bit line BLB. The bit lines BLT and BTB are wired in the X direction, and a memory cell MC is connected to an intersection of each of the bit lines BLT and BTB with each of the word lines WL. The memory cell MC has a configuration of a serial circuit of a cell transistor Tr and a cell capacitor C. A gate electrode of the cell transistor Tr is connected to its corresponding word line WL, and a source/drain of the cell transistor Tr are connected to their corresponding bit line BLT or BTB. With this configuration, when a predetermined word line WL is activated based on a row address, a slight potential difference is generated between corresponding bit lines BLT and BTB, and the potential difference is amplified by the sense amplifier SA.

The bit lines BLT and BTB and the sense amplifier SA are respectively connected to the sub-data lines LIOT and LIOB via the column switches YS. The column switch YS is configured with an N-channel MOS transistor, and corresponding one of column select signals YSW (YSW0, YSW1, . . . ) is supplied to a gate electrode of the N-channel MOS transistor. The column select signals YSW are generated based on a column address, and one column select signal YSW is activated for a pair of the sub-data lines LIOT and LIOB. With this operation, the read data amplified by the sense amplifiers SA are transferred to the sub-data lines LIOT and LIOB via the column switches YS.

Referring back to FIG. 1, the sub-data lines LIOT and LIOB that are wired in the Y direction are connected to an assist amplifier 50 and the switch circuit 40 that are arranged in a so-called "cross area". The cross area indicates an intersection of an extending direction of the word drivers WD that are arranged in the X direction with an extending direction of the sense amplifiers SA and the column switches YS arranged in the Y direction. Because there is no word driver WD, no sense amplifier SA, and no column switch YS arranged in the cross area, it is suitable for positioning the assist amplifier 50 and the switch circuit 40.

Figure 3:
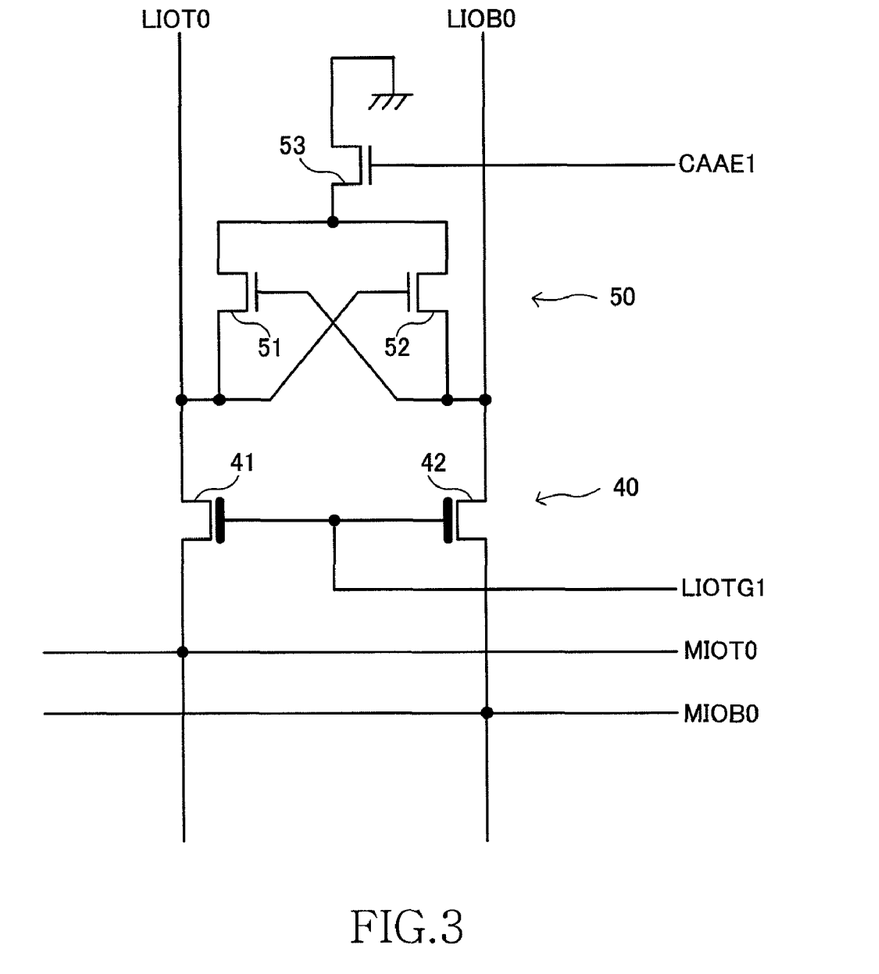
FIG. 3 is a circuit diagram of the assist amplifier 50 and the switch circuit 40.

FIG. 3 is a circuit diagram of the assist amplifier 50 and the switch circuit 40.

As shown in FIG. 3, the assist amplifier 50 includes two N-channel assist transistors 51 and 52 that are cross-coupled to each other, which are activated by corresponding one of activation signals CAAE (CAAE1, CAAE2, . . . ). Specifically, a drain electrode and a gate electrode of the assist transistor 51 are connected to the sub-data lines LIOT and LIOB, respectively, a drain electrode and a gate electrode of the assist transistor 52 are connected to the sub-data lines LIOB and LIOT, respectively, and source electrodes of the assist transistors 51 and 52 are connected to a ground potential VSS (a first potential) via an N-channel MOS transistor 53. The activation signal CAAE is supplied to a gate electrode of the transistor 53.

With this configuration, when the corresponding one of the activation signals CAAE is set to the high level, the assist amplifier 50 drives one of the sub-data lines LIOT and LIOB which has a lower potential to the ground potential VSS. In a period before the assist amplifier 50 is activated at the time of a read operation, the sub-data lines LIOT and LIOB are driven by the sense amplifier SA, by which a potential difference generated between the sub-data lines LIOT and LIOB is amplified by the assist amplifier 50.

Meanwhile, the switch circuit 40 includes an N-channel switch transistor 41 connected between the sub-data line LIOT and the main data line MIOT and an N-channel switch transistor 42 connected between the sub-data line LIOB and the main data line MIOB. Corresponding one of connection signals LIOTG (LIOTG1, LIOTG2, . . . ) is commonly supplied to gate electrodes of the switch transistors 41 and 42, so that the switch transistors 41 and 42 are caused to be conductive or non-conductive by a potential of the connection signal LIOTG. However, the connection signal LIOTG does not take a binary logic, but a three-valued logic. Details thereof are described later.

The switch transistors 41 and 42 constituting the switch circuit 40 and the assist transistors 51 and 52 and the transistor 53 constituting the assist amplifier 50 are all N-channel MOS transistors. Although it is not essential that all these transistors be N-channel types in the present invention, since only the N-channel MOS transistors are employed in the present embodiment, there is no need for providing an isolating area for isolating N-channel MOS transistors and P-channel MOS transistors from each other, which makes it possible to save the entire occupation dimension.

Furthermore, in the present embodiment, thicknesses of gate insulation films of the switch transistors 41 and 42 constituting the switch circuit 40 are designed to be larger than thicknesses of gate insulation films of the assist transistors 51 and 52 constituting the assist amplifier 50. This is indicated by thicker lines of the gate electrodes of the switch transistors 41 and 42 shown in FIG. 3. With this configuration, a withstand voltage between the gate and the source of each of the switch transistors 41 and 42 is higher than that of each of the assist transistors 51 and 52. Such a design is adopted because, as described later, amplitudes of the connection signals LIOTG are larger than amplitudes of signals that are transferred through the sub-data lines LIOT and LIOB.

The activation signal CAAE and the connection signal LIOTG respectively supplied to the assist amplifier 50 and the switch circuit 40 are supplied from corresponding one of control units 61, 62, . . . shown in FIG. 1. As shown in FIG. 1, each of the control units 61, 62, . . . is provided for every one of the assist amplifier 50 and the switch circuit 40, and it is controlled by the control units 61, 62, . . . to transfer data of the sub-data lines LIOT and LIOB to the main data lines MIOT and MIOB. Corresponding one of select signal MS1, MS2, . . . is input to each of the control units 61, 62, . . . , by which corresponding one of the control units 61, 62, . . . is activated. This causes data of corresponding one of pairs of the sub-data lines LIOT and LIOB to be transferred to the main data lines MIOT and MIOB.

Figure 4:
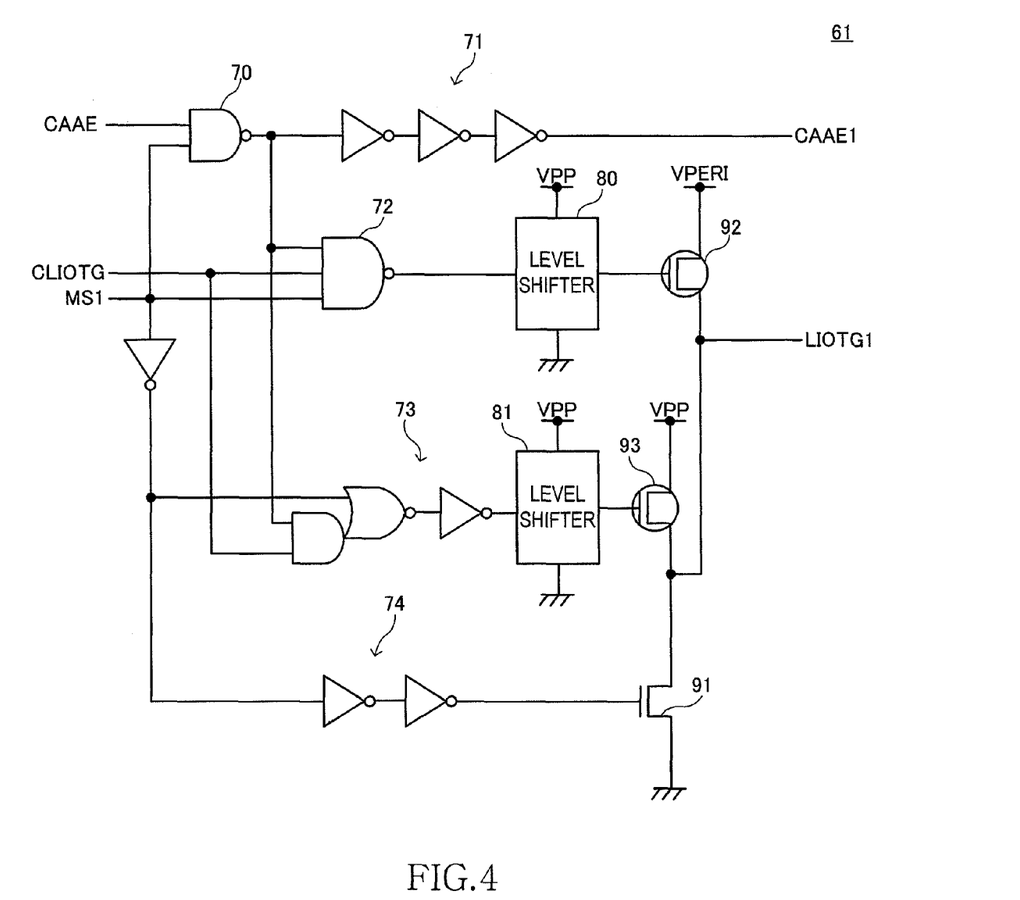
FIG. 4 is a circuit diagram of the control unit 61.

FIG. 4 is a circuit diagram of the control unit 61. Circuit configurations of the other control units 62, 63, . . . are the same as the circuit configuration of the control unit 61 shown in FIG. 4 except that the select signals MS2, MS3, . . . are respectively used instead of the select signal MS1.

As shown in FIG. 4, an activation signal CAAE, a connection signal CLIOTG, and the select signal MS1 are input to the control unit 61, based on which the activation signal CAAE1 and the connection signal LIOTG1 are generated. The select signal MS1 is a row system signal that is activated in response to an active (ACT) command, indicating a timing for activating the sense amplifier SA of its corresponding row. The activation signal CAAE and the connection signal CLIOTG are column system signals that are activated in response to a read (READ) command or a write (WRITE) command, respectively defining operation timings of the assist amplifier 50 and the switch circuit 40.

In a specific circuit configuration of the control unit 61, the activation signal CAAE and the select signal MS1 are input to a NAND circuit 70, and an output of the NAND circuit 70 that passed through an inverter array 71 is used as the activation signal CAAE1. Further, the connection signal CLIOTG, the select signal MS1, and the output of the NAND circuit 70 are input to a NAND circuit 72. An output of the NAND circuit 72 is supplied to a level shifter 80, by which an amplitude of the signal is shifted up from VPERI−VSS to VPP−VSS. A relation between magnitudes of the absolute values of VPP and VPERI is VPP>VPERI, and more preferably, VPP>VPERI+Vt (where Vt is a threshold voltage of each of the switch transistors 41 and 42). In some cases, VSS, VPERI, and VPP are referred to as a first potential, a second potential, and a third potential, respectively. An output of the level shifter 80 is supplied to a gate electrode of a P-channel MOS transistor 92.

On the other hand, the connection signal CLIOTG, an inverted signal of the select signal MS1 and the output of the NAND circuit 70 are supplied to a composite gate circuit 73. An output of the composite gate circuit 73 is supplied to a level shifter 81, by which an amplitude of the signal is shifted up from VPERI−VSS to VPP−VSS. An output of the level shifter 81 is supplied to a gate electrode of a P-channel MOS transistor 93. Furthermore, the inverted signal of the select signal MS1 is supplied to a gate electrode of an N-channel MOS transistor 91 via an inverter array 74.

As shown in FIG. 4, drains of the transistors 91 to 93 are commonly connected to each other, and the connection signal LIOTG1 is output from a connection point of the drains. A source of the transistor 91 is applied with VSS that is the first potential, a source of the transistor 92 is applied with VPERI that is the second potential, and a source of the transistor 93 is applied with VPP that is the third potential.

With this circuit configuration, when the activation signal CAAE and the select signal MS1 are set to the high level, a level of the activation signal CAAE1 is activated to VPERI that is the second potential. In other cases, the level of the activation signal CAAE1 is deactivated to VSS that is the first potential.

Furthermore, when the connection signal CLIOTG and the select signal MS1 are set to the high level and when the activation signal CAAE is set to the low level, the transistor 92 is switched on, and a level of the connection signal LIOTG1 is set to VPERI that is the second potential. When the select signal MS1 is set to the high level and when the connection signal CLIOTG is set to the low level or the activation signal CAAE is set to the high level, the transistor 93 is switched on, and the level of the connection signal LIOTG1 is set to VPP that is the third potential. In other cases, the level of the connection signal LIOTG1 is deactivated to VSS that is the first potential.

Figure 5:
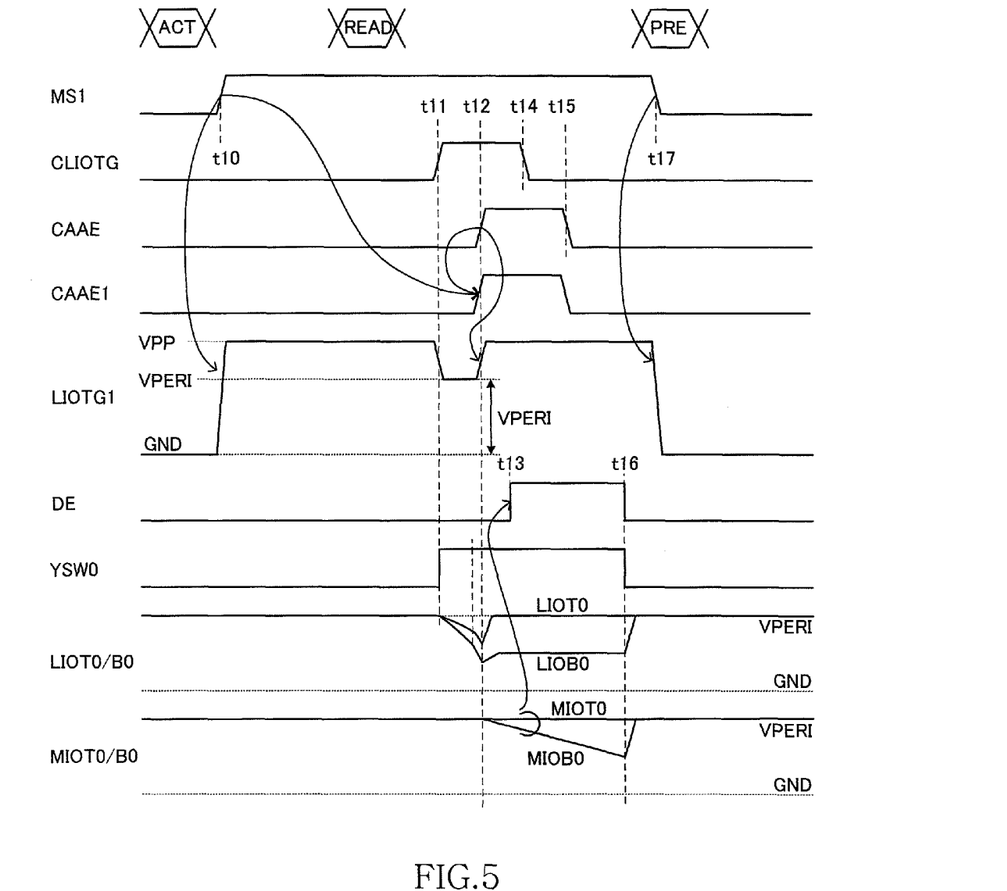
FIG. 5 is a timing chart for explaining a read operation of the semiconductor device according to the present embodiment.

FIG. 5 is a timing chart for explaining a read operation of the semiconductor device according to the present embodiment.

As shown in FIG. 5, when an active (ACT) command is issued from outside, the select signal MS1 is changed to the high level in response thereto at a time t10. At this time, the activation signal CAAE and the connection signal CLIOTG are still at the low levels. Because this causes the transistor shown in FIG. 4 to be switched on, the level of the connection signal LIOTG1 is changed from VSS (GND) to VPP. As a result, because the switch circuit 40 shown in FIG. 3 is switched on, the sub-data lines LIOT and LIOB and the main data lines MIOT and MIOB are precharged to the same potential. The precharge level is VPERI that is the second potential, and the precharge is performed by a precharge circuit 60 provided close to the data amplifier DAMP and the write buffer WBUF. The precharge can be performed from the sub-data lines LIOT and LIOB side or from both the main data lines MIOT and MIOB and the sub-data lines LIOT and LIOB sides.

Subsequently, when a read (READ) command is issued, the connection signal CLIOTG is changed to the high level in response to the read command for a period from a time t11 to a time t14, and the activation signal CAAE is changed to the high level for a period from a time t12 to a time t15. Because this causes the transistor 92 shown in FIG. 4 to be switched on, for a period from the time t11 to the time t12, the level of the connection signal LIOTG1 is changed from VPP to VPERI. As a result, because the switch circuit 40 shown in FIG. 3 is switched off, the sub-data lines LIOT and LIOB and the main data lines MIOT and MIOB are disconnected from each other. In this period, the column select signal YSW0 is activated, and potentials of the bit lines BLT and BTB amplified by the sense amplifier SA are transferred to the sub-data lines LIOT and LIOB. At this time, because the switch circuit 40 is switched off, a load to be driven by the sense amplifier SA is light, so that potentials of the sub-data lines LIOT and LIOB are quickly changed. The potentials of the sub-data lines LIOT and LIOB decrease at the time t11 because a drive voltage (VBL) of the sense amplifier SA is slightly lower than VPERI.

At the time t12, because the transistor 93 shown in FIG. 4 is switched on, the level of the connection signal LIOTG1 changed to VPP again. Because this causes the switch circuit 40 shown in FIG. 3 to be switched on, the sub-data lines LIOT and LIOB and the main data lines MIOT and MIOB are respectively connected to each other again. As a result, read data on the sub-data lines LIOT and LIOB are transferred to the main data lines MIOT and MIOB, respectively. At the same time, or before this operation, the level of the activation signal CAAE1 is changed to the high level, so that the assist amplifier 50 shown in FIG. 3 is activated. This accelerates changes of the potentials of the sub-data lines LIOT and LIOB and the main data lines MIOT and MIOB. It is preferable that a timing of the activation of the assist amplifier 50 is subject to a fine adjustment in such a manner that it is slightly earlier than a timing at which the level of the connection signal LIOTG1 is changed to VPP. With this operation, because re-connection of the sub-data lines LIOT and LIOB and the main data lines MIOT and MIOB is performed after an amount of amplifying the read data on the sub-data lines LIOT and LIOB is enlarged, it is possible to prevent inversion of data in an effective manner.

Subsequently, a level of a data enable signal DE is changed to the high level at the time t13 at which a sufficient potential difference is generated on the main data lines MIOT and MIOB, so that the data amplifier DAMP is activated. This causes the read data to be output to the read/write bus RWBS.

Thereafter, the data enable signal DE and the column select signal YSW0 are returned to the low levels at a time t16, and the select signal MS1 is returned to the low level at a time t17. Because this causes the transistor 91 shown in FIG. 4 to be switched on, the level of the connection signal LIOTG1 is changed from VPP to VSS, which completes a series of read operations.

In this manner, in the read operation of the present embodiment, because the switch circuit 40 is switched off by once lowering the level of the connection signal LIOTG to VPERI when transferring the read data from the bit lines BLT and BTB to the sub-data lines LIOT and LIOB, the main data lines MIOT and MIOB having large capacitances are disconnected at the time of connecting the column switches YS. As a result, a loss or inversion of data can be prevented, and at the same time, high-speed data transfer can be achieved.

In addition, when switching off the switch circuit 40, because the level of the connection signal LIOTG is not lowered to VSS, but is remained at VPERI, it is also possible to suppress the current required to charge and discharge the gate capacitances of the switch transistors 41 and 42. Moreover, when switching on the switch circuit 40, because the level of the connection signal LIOTG is set to VPP, there is no voltage drop due to the switch circuit 40.

In the present embodiment, although the level of the connection signal LIOTG1 is set to VPERI in the period from the time t11 to the time t12, the present invention is not limited to thereto. It suffices that the level of the connection signal LIOTG1 be set to a potential Vg that satisfies $$VSS < Vg < VL + Vt,$$

where VL is either one of the potentials of the sub-data lines LIOT and LIOB which is lower, VL+Vt is a potential (a fourth potential) with which the switch transistors 41 and 42 are switched on, and Vg can be a potential (a fifth potential) that has an absolute value smaller than that of the fourth potential and is higher than VSS (the first potential).

Figure 6:
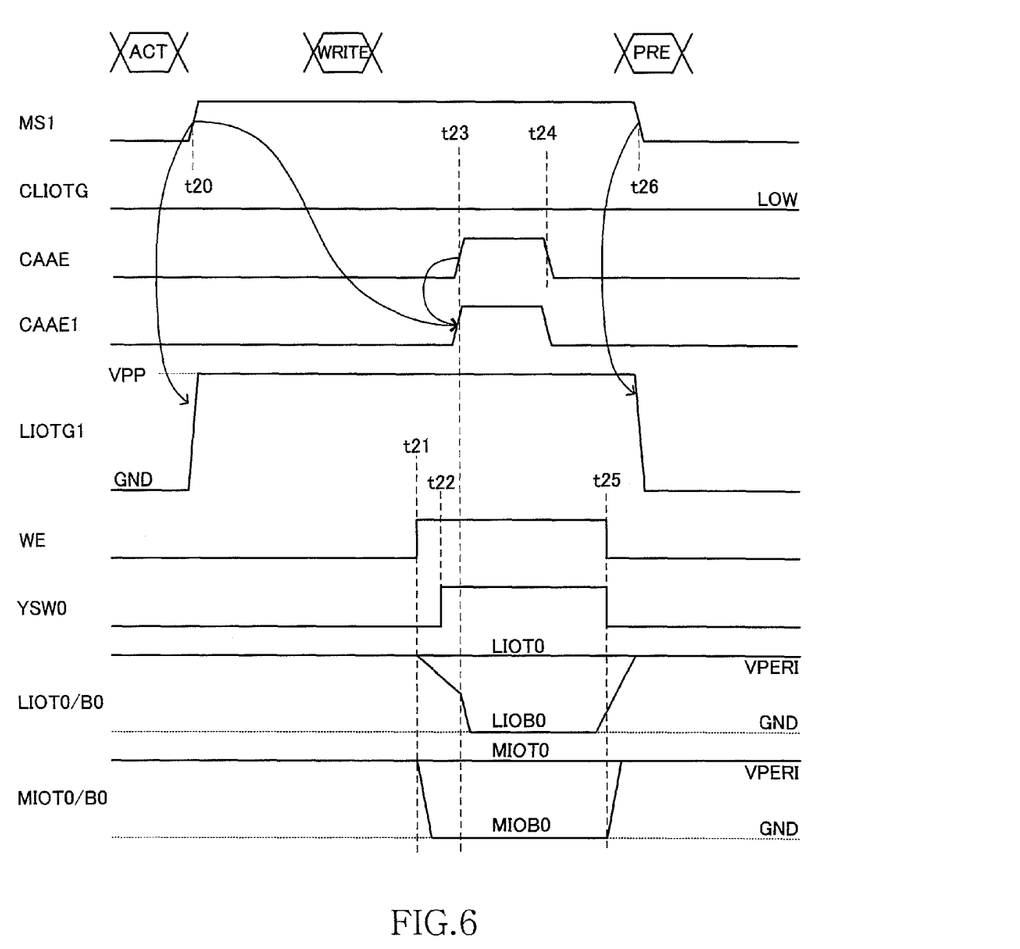
FIG. 6 is a timing chart for explaining a write operation of the semiconductor device according to the present embodiment.

FIG. 6 is a timing chart for explaining a write operation of the semiconductor device according to the present embodiment.

As shown in FIG. 6, at the time of a write operation, the connection signal CLIOTG is fixed to the low level, while the level of the activation signal CAAE is changed to the high level in a period from a time t23 to a time t24. Therefore, the level of the connection signal LIOTG1 is fixed to VPP for a period from a time t20 to a time t26.

During this period, the level of the write enable signal WE is changed to the high level in a period from the time t21 to the time t25, by which the write buffer WBUF is activated. This causes write data supplied to the read/write bus RWBS to be transferred to the main data lines MIOT and MIOB, so that one of the main data lines MIOT and MIOB swings at full range to VPERI and the other of the main data lines MIOT and MIOB swings at full range to VSS. The write data are then transferred to the sub-data lines LIOT and LIOB. Subsequently, the column select switch YSW0 is activated slightly later at a time t22, and transfer of data from the sub-data lines LIOT and LIOB to the bit lines BLT and BTB is performed. Thereafter, because the level of the activation signal CAAE is changed to the high level in a period from the time t23 to the time t24, the assist amplifier 50 is activated, and one of the sub-data lines LIOT and LIOB is rapidly driven to VSS. That is, one of the sub-data lines LIOT and LIOB swings at full range to VPERI, and the other of the sub-data lines LIOT and LIOB swings at full range to VSS.

In this manner, in the present embodiment, because the assist amplifier 50 is activated also in the write operation, it is possible to cause the sub-data lines LIOT and LIOB to swing at full range in a rapid manner.

It is apparent that the present invention is not limited to the above embodiments, but may be modified and changed without departing from the scope and spirit of the invention.

For example, in the embodiment described above, the sub-data lines LIOT and LIOB having an amplitude of VPERI–VSS are precharged to the level of VPERI before being accessed, and one of the sub-data lines LIOT and LIOB is driven to the level of VSS by using the assist amplifier 50. However, the opposite case is also acceptable, in which the sub-data lines LIOT and LIOB are precharged to the level of VSS before being accessed, and one of the sub-data lines LIOT and LIOB is driven to the level of VPERI by using the assist amplifier 50. In this case, it can be implemented by using P-channel type transistors for the transistors constituting the assist amplifier and the switch circuit. However, because the N-channel type is superior to the P-channel type in the current supplying performance per unit area, the method of the present embodiment is more advantageous in suppressing the circuit size.

In the present invention, it is not essential to provide the assist amplifier, so that it can be omitted from the configuration. In addition, the sub-data line and the main data line are not necessarily to be complementary lines, so that each of the sub-data line and the main data line can be a single-end type data line. Further, transistors used in the present invention do not have to be MOS transistors, and other types of transistors of other types can be also used.

What is claimed is:

1. A semiconductor device comprising:
    a main data line on which data having an amplitude between a first potential and a second potential are transferred;
    a sub-data line on which data having an amplitude between the first potential and the second potential are transferred;
    a switch transistor provided between the sub-data line and the main data line;
    a precharge circuit that precharges at least one of the sub-data line and the main data line to the second potential; and
    a control unit that supplies a third potential to a control electrode of the switch transistor so as to bring the switch transistor into a conductive state and supplies a fifth potential to the control electrode so as to bring the switch transistor into a non-conductive state, wherein
    a potential difference between the first and third potentials is larger than a potential difference between the first and second potentials,
    a potential difference between the first and fifth potentials is smaller than a potential difference between the first potential and a fourth potential, and
    a potential difference between the fourth potential and a potential of one of the sub-data line and the main data line defines a threshold voltage of the switch transistor.

2. The semiconductor device as claimed in claim 1, further comprising an assist amplifier that drives the sub-data line to the first potential.

3. The semiconductor device as claimed in claim 2, wherein the assist amplifier includes an assist transistor having a same conductivity type as the switch transistor.

4. The semiconductor device as claimed in claim 3, wherein both the assist transistor and the switch transistor are N-channel MOS transistors.

5. The semiconductor device as claimed in claim 4, wherein a thickness of a gate insulation film of the switch transistor is larger than a thickness of a gate insulation film of the assist transistor.

6. The semiconductor device as claimed in claim 2, further comprising:
    an external power source terminal to which an external power potential is supplied;
    a first internal power generating circuit that receives the external power potential and generates the second potential; and
    a second internal power generating circuit that receives the external power potential and generates the third potential, wherein
    the second potential is equal to or lower than the external power potential, and
    the third potential is higher than the external power potential.

7. The semiconductor device as claimed in claim 5, wherein the second potential and the fifth potential have substantially a same level.

8. The semiconductor device as claimed in claim 2, further comprising:
    a plurality of memory cell arrays laid out in a matrix form;
    a plurality of sense amplifiers and a plurality of column switches arranged between memory cell arrays adjacent to each other in a first direction; and
    a plurality of word drivers arranged between memory cell arrays adjacent to each other in a second direction, wherein
    each of the memory cell arrays includes a plurality of word lines connected to an associated one of the word drivers, a plurality of bit lines connected to an associated one of the sense amplifiers, and a plurality of memory cells each connected to an associated one of the word lines and an associated one of the bit lines, and
    each of the column switches is connected between an associated one of the sense amplifiers and the sub-data line.

9. The semiconductor device as claimed in claim 8, wherein the sub-data line extends in the second direction.

10. The semiconductor device as claimed in claim 9, wherein the main data line extends in the first direction.

11. The semiconductor device as claimed in claim 8, wherein the switch transistor and the assist amplifier are arranged at an intersection of the word drivers extending in a first direction with the sense amplifiers and the column switches extending in a second direction.

12. The semiconductor device as claimed in claim 8, further comprising a data amplifier circuit that drives the main data line, wherein
    the memory cell arrays, the sense amplifiers, the column switches, and the word drivers are arranged in a memory cell area, and
    the data amplifier circuit and the precharge circuit are arranged being adjacent to each other in an area outside the memory cell area.

13. The semiconductor device as claimed in claim 8, wherein when transferring the data from the sub-data line to the main data line, the control unit supplies the fifth potential to the control electrode in a first period, and supplies the third potential to the control electrode in a second period that follows the first period.

14. The semiconductor device as claimed in claim 13, wherein the column switch turns on in the first period.

15. The semiconductor device as claimed in claim 13, wherein the assist amplifier is brought into an activated state in the first period.

16. The semiconductor device as claimed in claim 13, wherein the control unit supplies the third potential to the control electrode in a third period which is just before the first period.

17. The semiconductor device as claimed in claim 16, wherein the control unit supplies the first potential to the control electrode in periods just before the third period and just after the second period.

18. The semiconductor device as claimed in claim 8, wherein the control unit fixes a potential to be supplied to the control electrode to the third potential when transferring the data from the main data line to the sub-data line.

19. A method of controlling a semiconductor device comprising:
    providing the semiconductor device having a hierarchical data line structure performing transfer of data having an amplitude between a first potential and a second potential by controlling a switch transistor connected between a sub-data line and a main data line;
    supplying a third potential to a control electrode of the switch transistor, a potential difference between the first and third potentials being larger than a potential difference between the first and second potentials;
    supplying a fifth potential to the control electrode after the supplying the third potential, a potential difference between the first and fifth potentials being smaller than a potential difference between the first potential and a fourth potential, and a potential difference between the fourth potential and a potential of one of the sub-data line and the main data line defining a threshold voltage of the switch transistor; and
    supplying the third potential again to the control electrode after the supplying the fifth potential.

* * * * *